(12) United States Patent
Sudoh (10) Patent No.: US 8,508,870 B2
(45) Date of Patent: Aug. 13, 2013

(54) SUPPORTING DEVICE, OPTICAL APPARATUS, EXPOSURE APPARATUS, AND DEVICE MANUFACTURING METHOD

(75) Inventor: Yuji Sudoh, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 226 days.

(21) Appl. No.: 13/172,695

(22) Filed: Jun. 29, 2011

(65) Prior Publication Data

US 2011/0255183 A1    Oct. 20, 2011

Related U.S. Application Data (63) Continuation of application No. 12/876,921, filed on Sep. 7, 2010, now Pat. No. 8,064,152.

(30) Foreign Application Priority Data

Sep. 11, 2009   (JP) .................................. 2009-210353

(51) Int. Cl.
*G02B 7/02* (2006.01)

(52) U.S. Cl.
USPC .......................................... 359/820; 359/822

(58) Field of Classification Search
USPC ................................ 359/694–704, 811–824
See application file for complete search history.

(56) References Cited

U.S. PATENT DOCUMENTS 6,122,114 A  *  9/2000  Sudo et al. .................... 359/819

* cited by examiner

*Primary Examiner* — James Jones
(74) *Attorney, Agent, or Firm* — Canon USA Inc IP Division (57) ABSTRACT

The present invention provides a supporting device that supports an optical element, comprising: a first supporting member that is fixed to an outer circumference of the optical element; a plurality of members that is connected to an outer circumference of the first supporting member; and a second supporting member that supports the first supporting member via the plurality of members, wherein each of the plurality of members is configured such that the a rigidity thereof in a first direction inclined relative to a direction orthogonal to an optical axis of the optical element in a plane including the optical axis is lower than a rigidity thereof in each of two directions that are orthogonal to the first direction and that are orthogonal to each other.

7 Claims, 6 Drawing Sheets

SUPPORTING DEVICE, OPTICAL APPARATUS, EXPOSURE APPARATUS, AND DEVICE MANUFACTURING METHOD

CROSS-REFERENCE TO RELATED APPLICATIONS

This application is a continuation of U.S. patent application Ser. No. 12/876,921 filed Sep. 7, 2010 and entitled "SUPPORTING DEVICE, OPTICAL APPARATUS, EXPOSURE APPARATUS, AND DEVICE MANUFACTURING METHOD", which claims the benefit of Japanese Patent Application No. 2009-210353 filed on Sep. 11, 2009, all of which are hereby incorporated by reference herein in their entirety.

BACKGROUND OF THE INVENTION

1. Field of the Invention

The present invention relates to a supporting device for supporting an optical element, an optical apparatus, an exposure apparatus, and a device manufacturing method.

2. Description of the Related Art

An exposure apparatus exemplified by a semiconductor exposure apparatus is an apparatus that transfers a pattern formed on an original plate (e.g., reticle) onto a substrate (e.g., silicon wafer). During pattern transfer, a projection optical system is employed for imaging the pattern on the reticle onto a wafer. In order to produce a highly integrated circuit, a high resolving power is required for the projection optical system. For example, in a projection optical system for the semiconductor exposure apparatus, the uniformity of various properties related to glass material and film is required in order to significantly suppress aberration. Consequently, the processing accuracy and the fabricating accuracy of the surface shape of a glass need to be enhanced. A lens barrel for supporting a glass used for a lens is generally formed of a metal or the like which is a different material from a glass.

Figure 11:
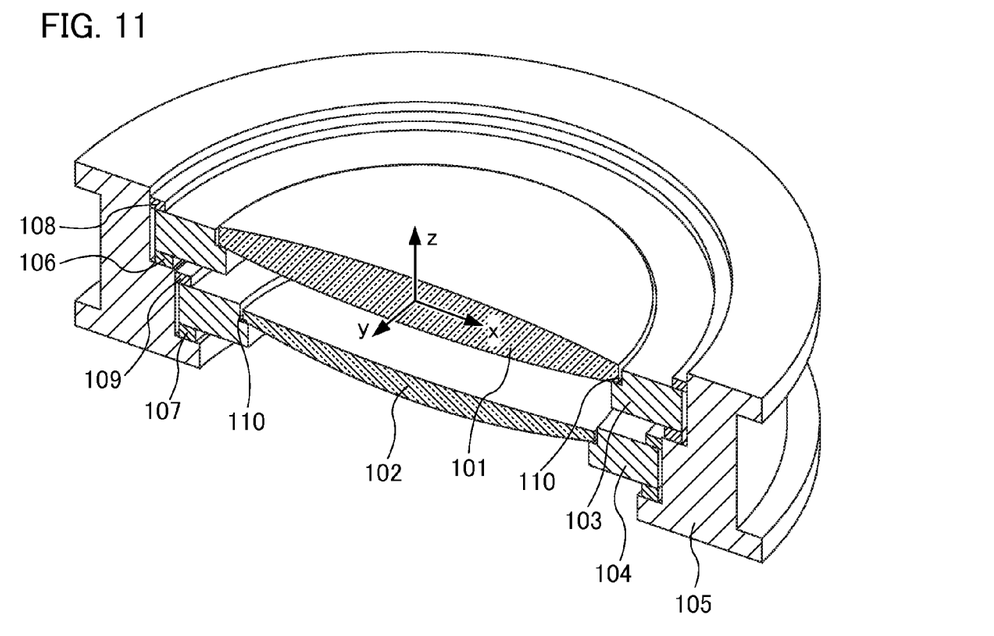
FIG. 11 is a perspective view illustrating the state in which a conventional supporting device is cut along its diameter.

FIG. 11 is a perspective view illustrating the state in which a conventional supporting device is cut along its diameter, which shows the concept of a lens barrel structure. In FIG. 11, a lens 101 and a lens 102 are fixed to a metal frame 103 and a metal frame 104, respectively. The metal frames 103 and 104 are stacked in a cylindrical supporting member 105 by sandwiching spacers 106 and 107 for air gap adjustment, respectively, and are fixed by screw rings 108 and 109, respectively, by pressing from above.

However, in the lens barrel structure described above, the shape change of the lens or the lens barrel component due to changes in temperature of the environment may change the aberration. In particular, in the exposure apparatus that employs a short wavelength light source, a glass such as quartz or fluorite is used for a lens. However, the material of a lens, a lens barrel component for supporting the same, and the like have different coefficients of thermal expansion. Hence, these components cannot be uniformly expanded or contracted freely without being affected by other members. Consequently, the shape of the surface of the lens may change due to changes in temperature of the environment and the like, and thus the deformation has an effect on the aberration of a lens that cannot be ignored.

Solutions for solving the problem include the techniques disclosed in Japanese Patent Laid-Open Nos. 08-68899 and No. 10-96843. In the technique disclosed in Japanese Patent Laid-Open No. 08-68899, an optical element is supported by an elastic member that elastically deforms in a direction perpendicular to the optical axis of the optical element. Also, in the technique disclosed in Japanese Patent Laid-Open No. 10-96843, an optical element is supported by a non-elastic member that is pivotable about an axis parallel with the optical axis. In either case, the strain and stress of the optical element can be reduced even when the optical element and the metal frame expand or contract due to changes in temperature of the environment, whereby the optical element can be stably supported.

However, in the prior art such as the techniques disclosed in the patent documents described above, for example, in the technique disclosed in Japanese Patent Laid-Open No. 08-68899, it is a concern that the birefringence is likely to occur. The cause of the birefringence is that a restraining force is insufficient since an adhesive for fixing the optical element is circumferentially dispersed around a circumference of the optical element or because the distribution of pressure applied to the optical element is not uniform when the optical element is directly connected to an elastic member. Also, in the technique disclosed in Japanese Patent Laid-Open No. 10-96843, a pivoting member is directly joined to an optical element, whereby the optical element may receive a local couple on its joint section. This is not preferable because this may cause changes in the shape of the optical element.

In view of the above, the optical element is generally fixed to a ring-shaped supporting member having a linear expansion coefficient close to that of the material of the optical element by adhesion around its entire circumference, and the ring-shaped supporting member is then supported by an elastic member or a pivoting member. However, as disclosed in the patent documents described above, the displacement direction of the elastic member or the pivoting member for supporting the optical element is perpendicular to the direction of the optical axis, resulting in creating new difficulties. In the actual industrial products, it is difficult to dispose the center of gravity of the optical element, the sites for supporting the optical element in the gravitational force direction, and the position of the elastic member or the pivoting member on the same plane. Consequently, when the optical element and its supporting member expand or contract due to changes in temperature of the environment, this expansion or contraction is not uniform.

Figure 12A:
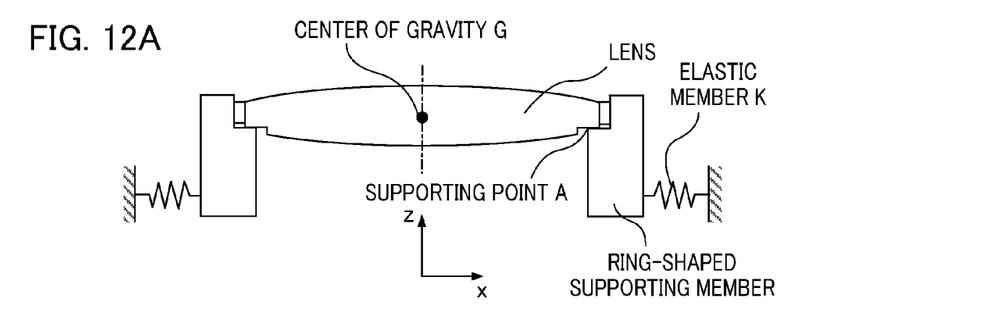
FIG. 12A is a schematic side view illustrating the conventional supporting device.
Figure 12B:
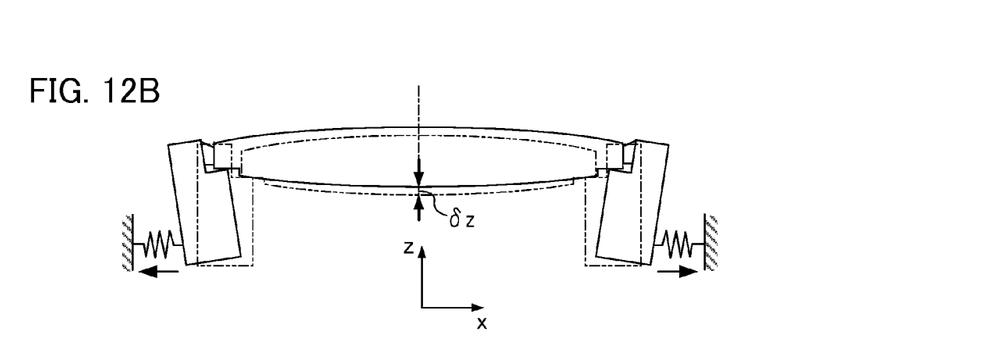
FIG. 12B is a side view illustrating how the conventional supporting device is expanded when temperature of the environment is raised.

FIG. 12A is a schematic side view illustrating a case in which the center of gravity G of the lens, the supporting point A of a portion (ring-shaped supporting member) that supports the lens in the gravitational force direction, and the elastic member K shown in FIG. 11 are not positioned in a co-planar arrangement. FIG. 12B is an exaggerated side view illustrating how the lens and the ring-shaped supporting member expand due to a rise in temperature of the environment. When the lens and the ring-shaped supporting member independently expand due to a rise in temperature of the environment, the elastic member K is deformed in the direction of elasticity (the x direction in FIGS. 12A and 12B) so as to alleviate distortion caused by the expansion. However, since the elastic coefficient is not zero, a resisting force for suppressing the expansion is produced. Also, even when the elastic member K shown in FIG. 12 is a pivoting member disclosed in Japanese Patent Laid-Open No. 10-96843, the resisting force for suppressing the expansion is produced in a similar manner due to the friction of the pivoting section. By this means, the difference in the amount of deformation occurs between the section at which the elastic member K is provided and the vicinity of the lens supporting point A that is remote from the section in the z direction. As a result, the lens supporting point A is displaced in the +z direction (upward direction in FIG. 12B), and thus the lens is displaced in the +z direction (the displacement amount is shown by δz in FIG. 12B), resulting in a decrease in optical performance. In other words, the optical element is displaced in the optical axis direction depending on the rigidity of an elastic member used for relaxing the deformation of the optical element, upon a temperature change, resulting in the decrease in optical performance.

SUMMARY OF THE INVENTION

The present invention provides, for example, a supporting device for supporting an optical element, which is advantageous in a stability of an optical characteristic upon temperature change.

In view of the foregoing, according to an aspect of the present invention, A supporting device that supports an optical element, the device comprises: a first supporting member that is fixed to an outer circumference of the optical element; a plurality of members that is connected to an outer circumference of the first supporting member; and a second supporting member that supports the first supporting member via the plurality of members, wherein each of the plurality of members is configured such that the a rigidity thereof in a first direction inclined relative to a direction orthogonal to an optical axis of the optical element in a plane including the optical axis is lower than a rigidity thereof in each of two directions that are orthogonal to the first direction and that are orthogonal to each other.

The present invention may provide, for example, a supporting device for supporting an optical element, which is advantageous in a stability of an optical characteristic upon temperature change.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings. While the following description will be made using specific numeric values, configurations, operations, and the like, these may be appropriately changed according to the specification.

First Embodiment

Figure 1:
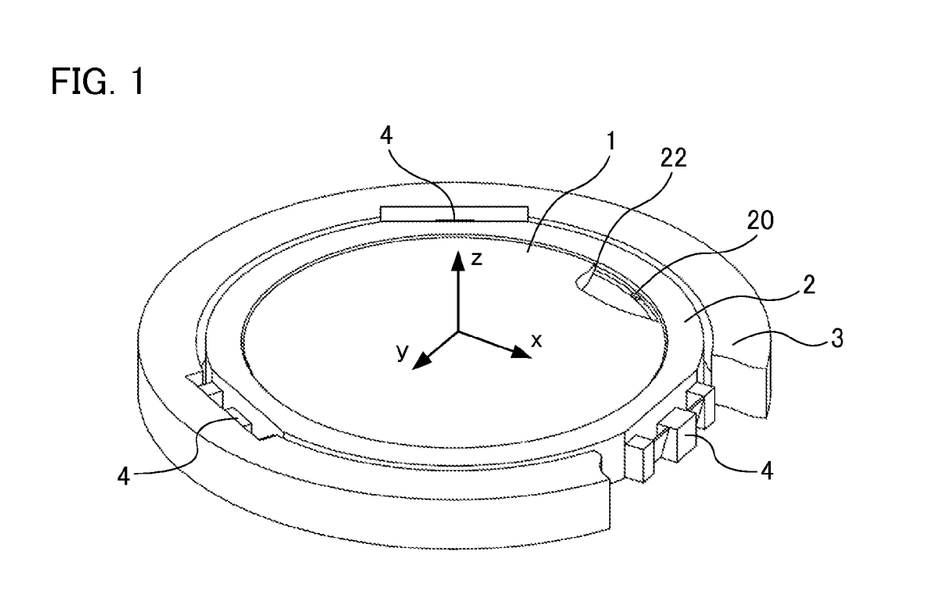
FIG. 1 is a perspective view illustrating a supporting device according to a first embodiment of the present invention.

FIG. 1 is a perspective view illustrating a supporting device according to a first embodiment of the present invention. For the convenience of explanation, a part of a lens 1 is cut out. The x, y, and z axes shown in FIG. 1 represent the three-dimensional orthogonal coordinate axes. The gravitational force direction is coincident with the optical axis of the lens 1, and is the −z direction. In the supporting device of the present embodiment, a ring-shaped supporting member 2 is used as a first supporting member to support the lens 1. Three projections 20 that support the peripheral portion of the lens 1 in the gravitational force direction are formed on the ring-shaped supporting member 2. The three projections 20 are provided at an angle interval of 120 degrees around the optical axis. The lens 1 is fixed to the supporting member 2 via an adhesive 22 that is filled over the entire circumference of the space between the peripheral edge of the lens 1 and the radial direction of the supporting member 2. In other words, the outer peripheral portion of the lens 1 is fixed to the supporting member 2 via the adhesive 22. A supporting member 3, which serves as a second supporting member, coaxially supports the lens 1. In FIG. 1, the supporting member 3 is partially cut out to show the elastic member 4 including the plate-shaped spring 24 provided thereon.

Figure 2:
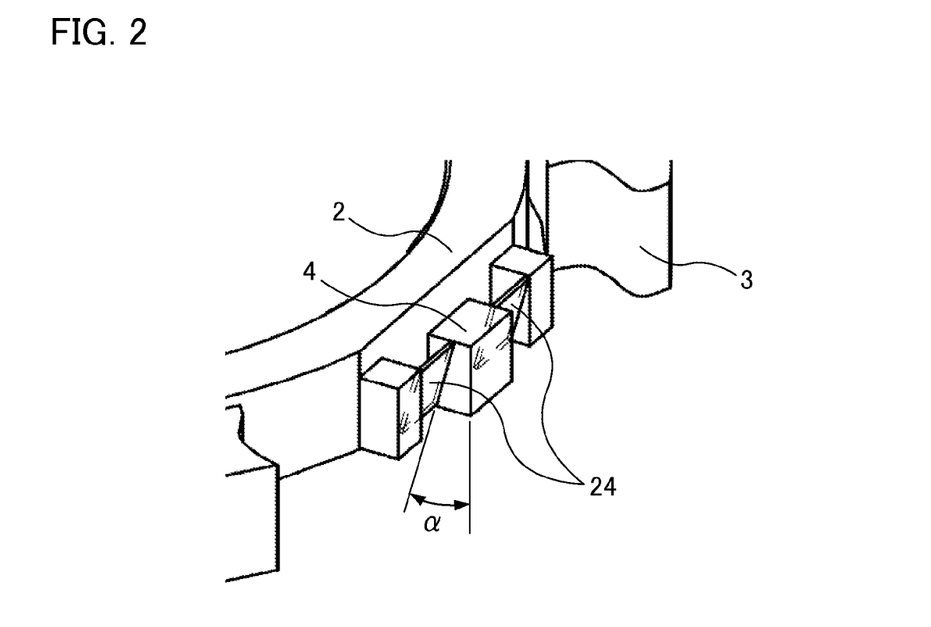
FIG. 2 is an enlarged perspective view illustrating the periphery of an elastic member 4 shown in FIG. 1.

FIG. 2 is an enlarged perspective view illustrating the periphery of the elastic member 4 shown in FIG. 1 by partially cutting out the supporting member 3. The elastic member 4 has a structure such that the central portion thereof is connected to two end portions thereof via the plate-shaped spring 24. Both end portions of the elastic member 4 are connected to the supporting member 2, whereas the central portion thereof is connected to the supporting member 3. As shown in FIG. 2, the plate-shaped spring 24 is provided such that it is inclined by a degrees with respect to the z axis. Here, an axis inclined with respect to a direction perpendicular (orthogonal) to the optical axis in a plane including the optical axis of the lens 1 is defined as a "first axis", and two axes that are perpendicular to the first axis and mutually orthogonal to each other are defined as a "second axis" and a "third axis", respectively. For the elastic member 4, the rigidity in the first axis direction is lower than that in the second and third axis directions. The elastic member 4 has low rigidity in the direction inclined by a degrees with respect to the axis direction perpendicular to the optical axis (the radial direction of the lens 1, e.g., the x-axis direction). While in the present embodiment, the material of the lens 1 is quartz, the present invention is not particularly limited thereto.

Figure 3:
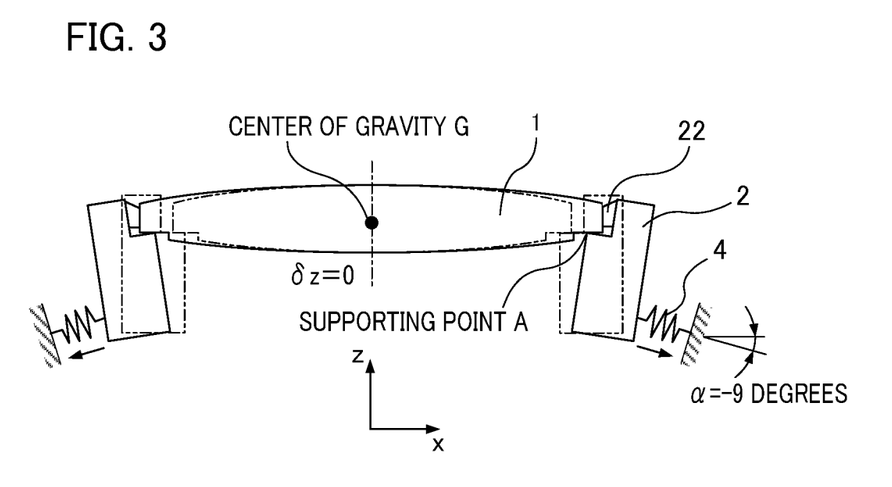
FIG. 3 is a schematic side view illustrating the supporting device according to the first embodiment of the present invention.

Next, the operation of the first embodiment will now be described. FIG. 3 is a schematic side view illustrating the supporting device of the present embodiment when viewed from the y-axis direction as in FIG. 12. The point G in FIG. 3 represents the center of gravity of the lens 1. When each of the lens 1 and the supporting member 2 is expanded due to an environmental temperature change, the differences in the amount of expansion of the respective components are similar to those of the prior art. In other words, the amount of expansion of the supporting member 2 is different between the portion at which the elastic member K is provided and the vicinity of the lens supporting point A that is at a distance from the portion in the z direction. In the present embodiment, since the direction of elasticity of the elastic member K is inclined by a degrees with respect to the x axis, the entire member K is displaced in the −z direction by the expansion of the supporting member 2. Consequently, the z directional position of the lens supporting point A remains the same as compared with the position prior to expansion ($\delta z$=0).

Figure 4:
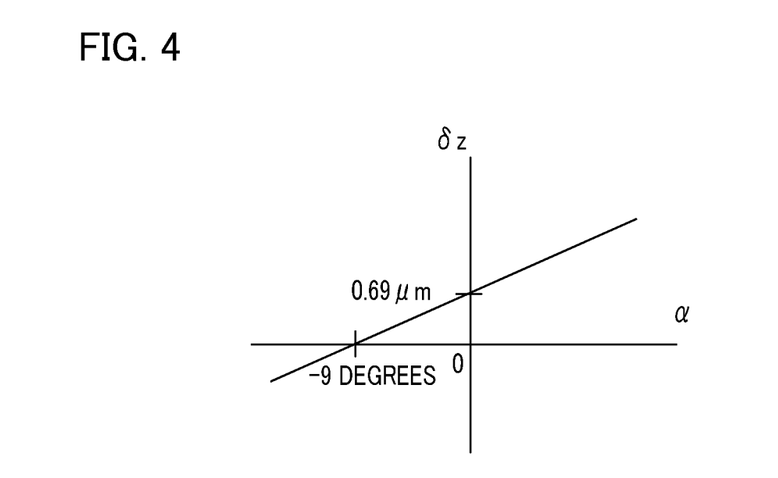
FIG. 4 is a graph illustrating the result of the computation of the relationship between the inclination angle α of a leaf spring (plate-shaped spring) 24 and the z directional displacement amount of a lens support section when temperature of the environment is raised by one degree by using a finite element method.

FIG. 4 is a graph illustrating an exemplary result of the computation of the relationship between the inclination angle $\alpha$ (horizontal axis) of the plate-shaped spring 24 and the z directional displacement amount ($\delta z$) (vertical axis) of a lens support section when temperature of the environment is raised by one degree by using a finite element method.

The amount of change in temperature of the environment and the z directional displacement amount of the lens support section have a linear relationship. Hence, when the amount of change in temperature of the environment is changed, the linear slope shown in FIG. 4 is changed, whereas the value of the x-intercept (the intercept of the horizontal axis) is not changed. In the present embodiment, even when the lens 1 and the supporting member 2 expand or contract due to the effect of an environment temperature change, the inclination angle $\alpha$ through which the lens support section is not displaced in the z direction is −9 degrees. In other words, in the supporting device of the present embodiment, the position of the lens does not vary even when an environment temperature changes, given that the angle between the plate-shaped spring 24 and the z axis is −9 degrees. It should be noted that when temperature of the environment is raised by two degrees, the inclination angle doubles. Consequently, the displacement amount in the z direction also doubles, but the value of x-intercept is not changed.

Figure 5:
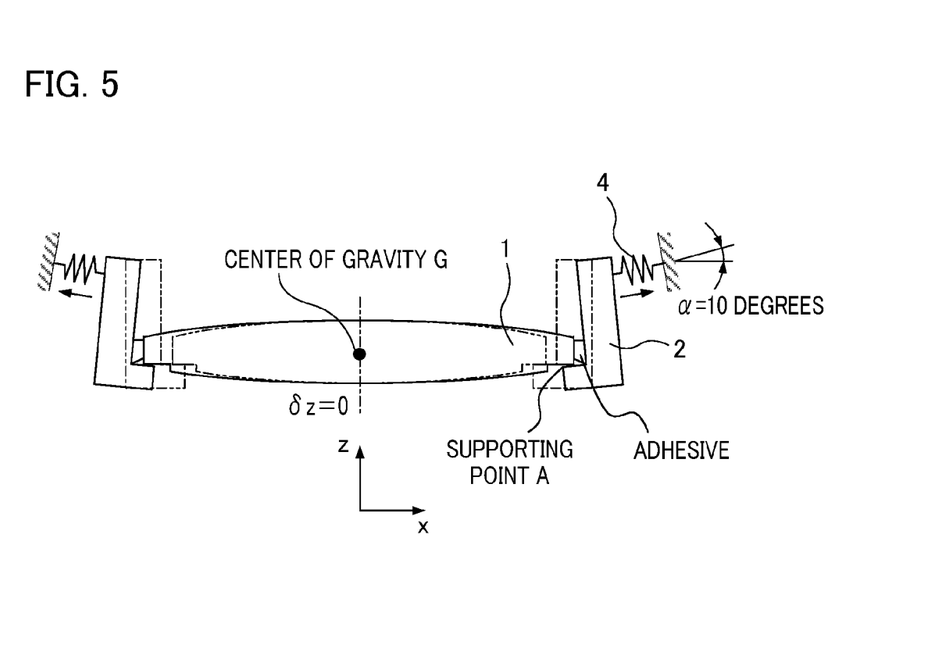
FIG. 5 is a schematic side view illustrating the movement of a lens and a supporting device that are different from those shown in FIG. 1.
Figure 6:
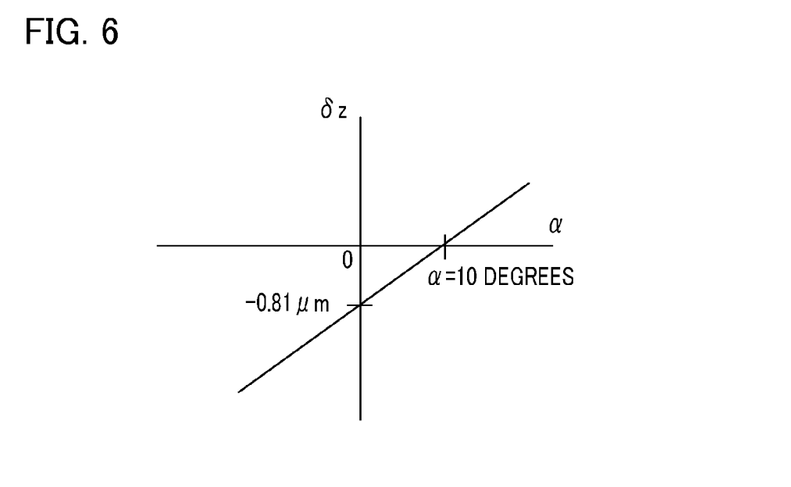
FIG. 6 is a graph illustrating the result of the computation of the relationship between the inclination angle α of a plate-shaped spring 24 in the case of FIG. 5 and the z directional displacement amount of a lens support section when temperature of the environment is raised by one degree by using a finite element method.

FIG. 5 is a schematic side view illustrating the movement of the supporting device of the alternative configuration of the lens and the supporting device shown in FIG. 1, when viewed from the y-axis direction. FIG. 6 is a graph illustrating an exemplary result of the computation of the relationship between the inclination angle $\alpha$ (horizontal axis) of the plate-shaped spring 24 and the z directional displacement amount (vertical axis) of a lens support section with the configuration shown in FIG. 5, when temperature of the environment is raised by one degree by using a finite element method.

As can be seen in FIGS. 5 and 6, since the elastic member K is disposed in the +z direction (upper in FIG. 5) with respect to the lens supporting point A, the lens supporting point A is displaced in the −z direction when the inclination angle $\alpha$ of the plate-shaped spring 24 is zero degrees, which is the reverse configuration shown in FIG. 3. In this example, the inclination angle $\alpha$ of the plate-shaped spring 24, by which the lens is not displaced in the z direction even when an environment temperature changes, is ten degrees. In other words, for implementing the present invention, the optimum inclination angle of the plate-shaped spring 24 may be varied depending on the positional relationship between the elastic member and the optical element supporting member in the z direction, and the rigidity of the supporting member and the rigidity of the elastic member. Thus, in consideration of the above, the relationship between the inclination angle of the plate-shaped spring 24 and the z directional displacement amount of the lens support section is determined by calculation or experiments in advance, whereby the optimum inclination amount of the plate-shaped spring 24 may be determined. By using the configuration described above, a change in the lens position caused by an environment temperature change may be reduced, the displacement amount approaches zero, the temperature stability of the optical system may be increased thereby.

Second Embodiment

Figure 7:
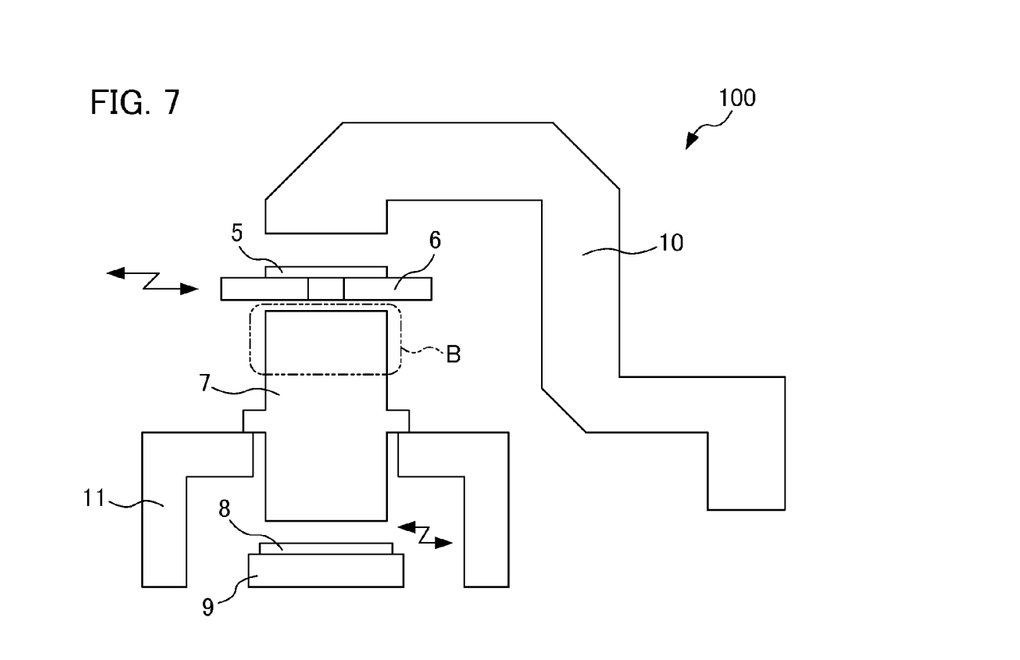
FIG. 7 is a schematic side view illustrating a semiconductor exposure apparatus to which the supporting device shown in FIG. 1 is applied.

Hereinafter, a second embodiment of the present invention will now be described in detail with reference to FIGS. 7 to 10. FIG. 7 is a schematic side view illustrating a semiconductor exposure apparatus to which the supporting device according to the present embodiment is applied. A semiconductor exposure apparatus 100 includes a reticle 5, a reticle stage 6, a projection lens system 7, a wafer 8, a wafer stage 9, an illumination optical system 10, and a frame 11 of the exposure apparatus. The reticle stage 6 moves in the left and right directions with the reticle 5 mounted thereon.

Illumination light for exposure is irradiated from the illumination optical system 10 to a part of the reticle 5 mounted on the reticle stage 6. The illumination light source may be, for example, an excimer laser having a wavelength of 193 nm (nanometer). The irradiation area is a slit-shaped irradiation area which partially covers the pattern area of the reticle 5. The pattern corresponding to the slit section is reduced in size to ¼ of the original and is projected on the wafer 8 mounted on the wafer stage 9 by the projection lens system 7. The projection lens system 7 is mounted on the frame 11 of the exposure apparatus. The reticle 5 and the wafer 8 are scanned relative to the projection lens system 7 to thereby transfer the pattern area of the reticle 5 onto a photoresist coated on the wafer 8. The scanning exposure is repeatedly performed relative to a plurality of transfer areas (shot) on the wafer 8. The projection lens system 7 requires a high level of resolution performance, and a highly accurate structure for the members that support the lens is also required.

Figure 8:
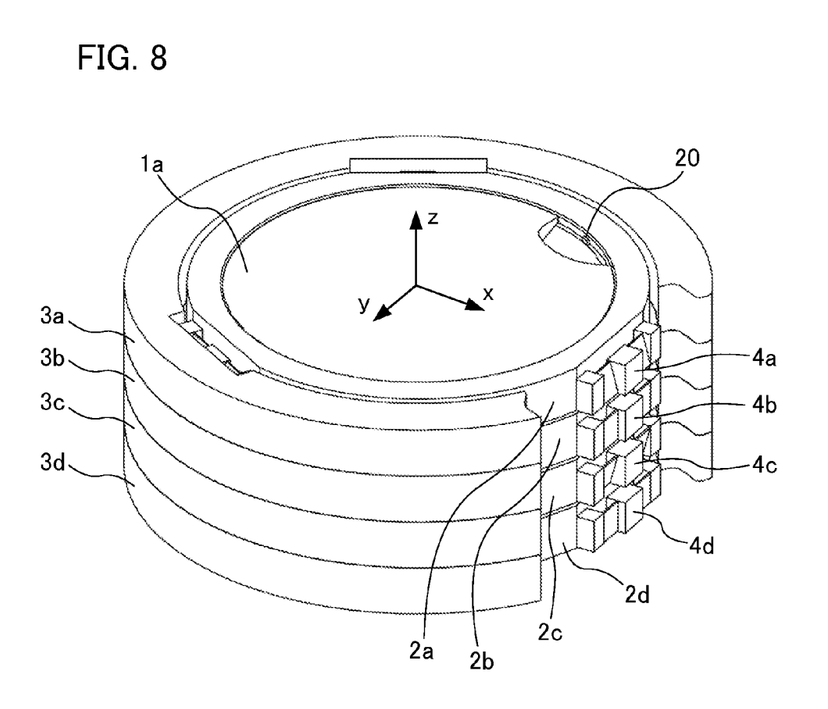
FIG. 8 is a perspective view illustrating a part of a projection lens system 7 to which a supporting device according to a second embodiment of the present invention is applied.

FIG. 8 is a perspective view illustrating a part of the projection lens system 7 to which the supporting device according to the second embodiment is applied, and shows the internal structure of the B part (the part enclosed in the frame shown by a two-dot chain line) shown in FIG. 7. As in FIG. 1, for ease of explanation, FIG. 8 is a partially cut-out view of the supporting member. In the present embodiment, a plurality of optical units each having the lens 1, the supporting member 2, and the supporting member 3 is provided in a stacked manner such that the optical units are stacked in the optical axis direction. The x, y, and z axes shown in FIG. 8 represent the three-dimensional orthogonal coordinate axes. The gravitational force direction is coincident with the optical axis of the respective optical units, and is the −z direction in FIG. 8.

The supporting members 2a to 2d directly support the lenses 1a to 1d, respectively. The supporting member 2a supports the lens 1a, the supporting member 2b supports the lens 1b (not shown), the supporting member 2c supports the lens 1c (not shown), and the supporting member 2d supports the lens 1d (not shown). The supporting members 2a to 2d are supported by the supporting members 3a to 3d having the shape of the lens barrel, respectively. In the present embodiment, the elastic members 4a to 4d are provided on the outer circumference of the supporting members 2a to 2d, respectively. In the present embodiment, in particular, each of the elastic members 4a and 4c is provided with a plate-shaped spring inclined with respect to the z axis, and each of the elastic members 4b and 4d is provided with a plate-shaped spring arranged along the z-axis direction.

Figure 9:
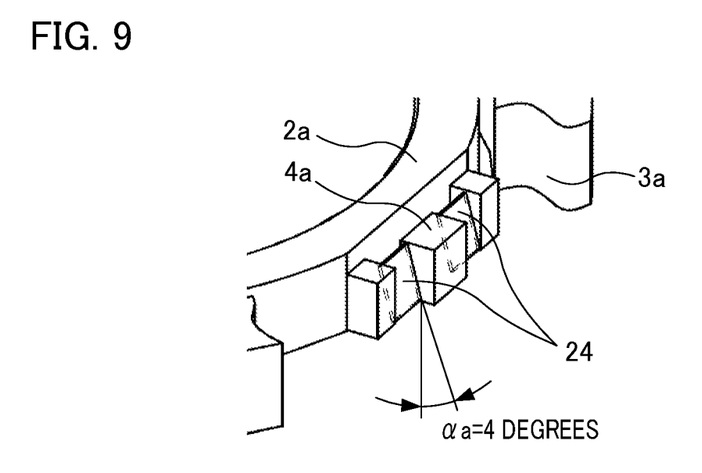
FIG. 9 is an enlarged perspective view illustrating the periphery of an elastic member 4a shown in FIG. 8.
Figure 10:
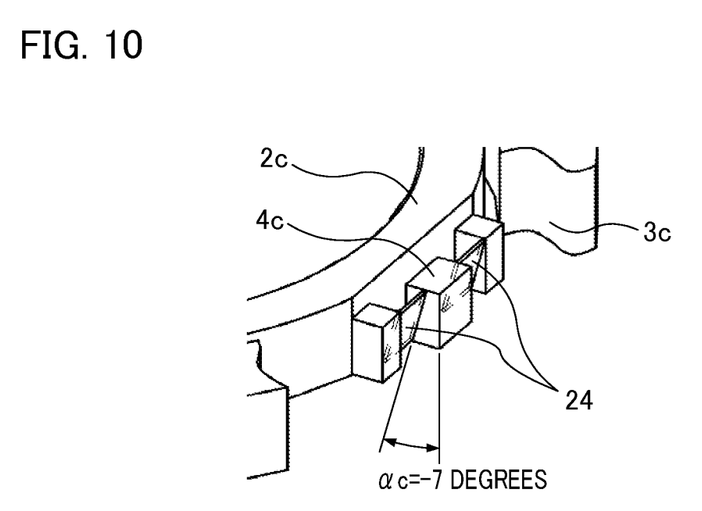
FIG. 10 is an enlarged perspective view illustrating the periphery of an elastic member 4c shown in FIG. 8.

FIG. 9 is an enlarged perspective view illustrating the periphery of the elastic member 4a shown in FIG. 8. FIG. 10 is an enlarged perspective view illustrating the periphery of the elastic member 4c shown in FIG. 8. For the convenience of explanation, the supporting members 3a and 3c are partially cut out in FIGS. 9 and 10. As shown in FIG. 9, the inclination angle αc of the plate-shaped spring with respect to the z-axis direction of the elastic member 4a is four degrees. As shown in FIG. 10, the inclination angle αc of the plate-shaped spring with respect to the z-axis direction of the elastic member 4c is −7 degrees. In this manner, the value and the positive or negative sign of the inclination angle is different in each case. It should be note that the definition of the sign of the inclination angle may be reversed in FIG. 9 and FIG. 10.

In such an arrangement, assume that a first optical element is the lens 1a and a second optical element is the lens 1c, the z directional displacement amounts of the lenses 1a and 1c per unit environment temperature change (per unit amount of change in temperature) are denoted as "$\delta z\_1a$" and "$\delta z\_1c$", respectively. For example, $\delta z\_1a=0.3$, and $\delta z\_1c=-0.5$. In other words, the lenses are displaced in directions opposite to each other. Note that the unit of the displacement amount is μm (micrometer).

Also, in the projection lens system to which the present embodiment is applied, the generated amount of the spherical aberration per unit displacement amount in the z direction of the lens 1a is denoted as "$SA\_1a$", and the generated amount of the spherical aberration per unit displacement amount in the z direction of the lens 1c is denoted as "$SA\_1c$". Here, the ratio between them is "$SA\_1a:SA\_1c=5:3$". This ratio corresponds to the inverse ratio of the absolute value of the displacement amount ratio "$\delta z\_1a:\delta z\_1c=3:-5$". While in the first embodiment, the value of the inclination angle of the plate-shaped spring 24 is determined so as not to change the position of the lens 1 even when an environment temperature changes, in the second embodiment, the positions of both of the lens 1a and the lens 1c are changed in association with an environment temperature change. However, each of the lens 1a and the lens 1c is displaced in the z direction due to a change in temperature of the environment so as to cancel out the spherical aberration generated by the lenses. Hence, the generated spherical aberration becomes zero ($SA\_1a \times \delta z\_1a30\ SA\_1c \times \delta z\_1c=0$). In other words, the value of the inclination angle of the plate-shaped spring 24 is set such that the generated amount of the spherical aberration caused by the displacement amount of the lenses is cancelled out by adjusting the displacement amount of the lenses.

With this arrangement, the aberration of the entire lens system, which is generated when an environment temperature changes, can be kept to a minimum, resulting in an increase in the temperature stability of the optical system. Also, according to the second embodiment, the z directional displacement amount of the entire optical system to which the present invention is applied can be reduced in comparison with the method of the first embodiment in which the z directional displacement amount of the lens in association with an environment temperature change is reduced for each lens. In other words, when an environment temperature changes, the aberration to be generated by the supporting device to which the present invention is not applied is calculated in advance, and the inclination angle may be set per each optical unit in order to cancel out the aberration by applying the present invention to the supporting device. Thereby, the aberration of the entire lens system during the environment temperature change can be efficiently kept to a minimum. While in the above description, spherical aberration is exemplified as an optical characteristic, the present invention is not limited thereto. The present invention can also handle other optical characteristics such as magnification, distortion and the like in a similar manner. In other words, the material and arrangement of the respective portions may be selected such that the amount of change in optical characteristics due to the displacement amount of the respective optical elements in the direction of the optical axis (the optical axis of each of the optical elements) of the optical apparatus per unit amount of change in temperature cancel each other out. The displacement of the center of gravity of the optical element is within a tolerance in the direction of the optical axis. The material may be selected by the attributes including rigidity. Also, the arrangement may include the mounting position and angle of the plate-shaped spring 24.

(Application to Other Systems)

While a description has been made of an example of a projection lens system provided in a semiconductor exposure apparatus, the present invention may also be applied to a reflection element such as a mirror or the like, a diffraction element, and an optical element wherein they may be used as an optical element in addition to a lens.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

The present invention is applicable to an optical-element supporting device provided in an optical apparatus such as an exposure apparatus that is employed in the semiconductor manufacturing process.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A supporting device that supports an optical element, the device comprising:

a first supporting member that is fixed to a first portion of an outer circumference of the optical element;

a plurality of members that is connected to a second portion of an outer circumference of the first supporting member; and a second supporting member that supports the first supporting member via the plurality of members, wherein each of the plurality of members is disposed between the first supporting member and the second supporting member in a first direction orthogonal to an optical axis of the optical element, and is configured such that a rigidity thereof in a second direction inclined relative to the first direction in a plane including the optical axis is lower than a rigidity thereof in each of two directions that are orthogonal to the second direction and that are orthogonal to each other so that a stress of the optical element in the first direction is within a tolerance and a displacement of a center of gravity of the optical element in a direction of the optical axis, due to a change in a dimension of at least one of the optical element and the first supporting member and a distance between the first portion and the second portion in the direction of the optical axis, is adjusted via a deformation of each of the plurality of members in the second direction.

2. The device according to claim 1, wherein each of the plurality of members includes a leaf spring.

3. The device according to claim 1, wherein the device has a material and an arrangement thereof such that the displacement due to a temperature change is within a tolerance.

4. The device according to claim 1, wherein the first supporting member includes a plurality of projections for supporting the optical element, and the first supporting member is fixed to the outer circumference of the optical element with an adhesive.

5. An optical apparatus comprising:
   an optical element; and
   a supporting device according to claim 1 that supports the optical element.

6. An exposure apparatus comprising an optical system, the exposure apparatus exposing a substrate to light via the optical system, wherein the optical system includes an supporting device according to claim 1 that supports an optical element included in the optical system.

7. A method of manufacturing a device, the method comprising:
   exposing a substrate to light using the exposure apparatus according to claim 6;
   developing the exposed substrate; and
   processing the developed substrate to manufacture the device.

* * * * *